US008939776B2

United States Patent
Liang et al.

(10) Patent No.: US 8,939,776 B2
(45) Date of Patent: Jan. 27, 2015

(54) CENTRAL PROCESSING UNIT SOCKET ASSEMBLY

(71) Applicant: ScienBiziP Consulting (Shen Zhen) Co., Ltd., Shenzhen (CN)

(72) Inventors: An-Gang Liang, Shenzhen (CN); Zheng-Heng Sun, New Taipei (TW)

(73) Assignee: ScienBiziP Consulting (Shen Zhen) Co., Ltd., Guangdong (CN)

( * ) Notice: Subject to any disclaimer, the term of this patent is extended or adjusted under 35 U.S.C. 154(b) by 0 days.

(21) Appl. No.: 13/779,762

(22) Filed: Feb. 28, 2013

(65) Prior Publication Data

US 2014/0199860 A1    Jul. 17, 2014

(30) Foreign Application Priority Data

Jan. 17, 2013 (CN) .......................... 2013 1 0017067

(51) Int. Cl.
*H01R 12/00* (2006.01)
*H05K 7/10* (2006.01)

(52) U.S. Cl.
CPC ........................................ *H05K 7/10* (2013.01)
USPC ........................................................... 439/78

(58) Field of Classification Search
USPC ........................... 439/73, 78, 68, 331, 135, 41
See application file for complete search history.

(56) References Cited

U.S. PATENT DOCUMENTS

| | | | | |
|---|---|---|---|---|
| 6,877,990 | B2 * | 4/2005 | Liao et al. | 439/41 |
| 7,029,295 | B2 * | 4/2006 | Liao | 439/135 |
| 7,059,863 | B2 * | 6/2006 | Ma | 439/41 |
| 7,070,428 | B2 * | 7/2006 | Ma | 439/135 |
| 7,090,517 | B2 * | 8/2006 | Ma | 439/135 |
| 7,112,066 | B2 * | 9/2006 | Liao et al. | 439/41 |
| 7,165,988 | B2 * | 1/2007 | Ma et al. | 439/331 |
| 7,264,487 | B2 * | 9/2007 | Liao | 439/135 |
| 7,517,229 | B2 * | 4/2009 | Ma | 439/73 |
| 7,753,687 | B2 * | 7/2010 | Fan | 439/41 |
| 2004/0266245 | A1 * | 12/2004 | Liao | 439/331 |
| 2005/0014411 | A1 * | 1/2005 | Ma | 439/331 |
| 2006/0116015 | A1 * | 6/2006 | Ju | 439/331 |
| 2007/0054532 | A1 * | 3/2007 | Ho | 439/331 |
| 2008/0045048 | A1 * | 2/2008 | Ma | 439/73 |
| 2008/0153323 | A1 * | 6/2008 | Ju et al. | 439/73 |
| 2008/0160814 | A1 * | 7/2008 | Howell | 439/331 |
| 2009/0075499 | A1 * | 3/2009 | Szu | 439/68 |

* cited by examiner

*Primary Examiner* — Alexander Gilman
(74) *Attorney, Agent, or Firm* — Novak Druce Connolly Bove + Quigg LLP

(57) ABSTRACT

A central processing unit socket assembly includes a socket mounted on a circuit board, a locking apparatus, and a cover. The cover includes a main plate, a resilient first locking portion formed on a first end of a first surface of the main plate, a second locking portion formed on a second end of the first surface of the main plate opposite to the first locking portion, and a number of connecting pins protruding out from a second surface of the main plate opposite to the first surface of the main plate. The first and second locking portion of the first surface of the cover can be detachably latched to the socket. The connecting pins can be connected on the locking apparatus.

10 Claims, 7 Drawing Sheets

CENTRAL PROCESSING UNIT SOCKET ASSEMBLY

BACKGROUND

1. Technical Field

The disclosure relates to a central processing unit (CPU) socket.

2. Description of Related Art

CPU sockets are exposed when the CPUs are not plugged in the CPU sockets. A CPU socket generally includes a socket for installing a CPU and a locking apparatus above the socket for installing a heat dissipation apparatus. In assembling the CPU socket to a motherboard, a first cover is covered on the socket for protecting the socket. A combination of the first cover and the socket is mounted on the motherboard by surface mount technology. When a locking apparatus is need to be mounted on the motherboard above the socket, the first cover is be removed and discarded, which is a waste of material. Furthermore, a second cover is needed to cover on the locking apparatus for protecting the socket, which increases the cost.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean "at least one."

Figure 1:
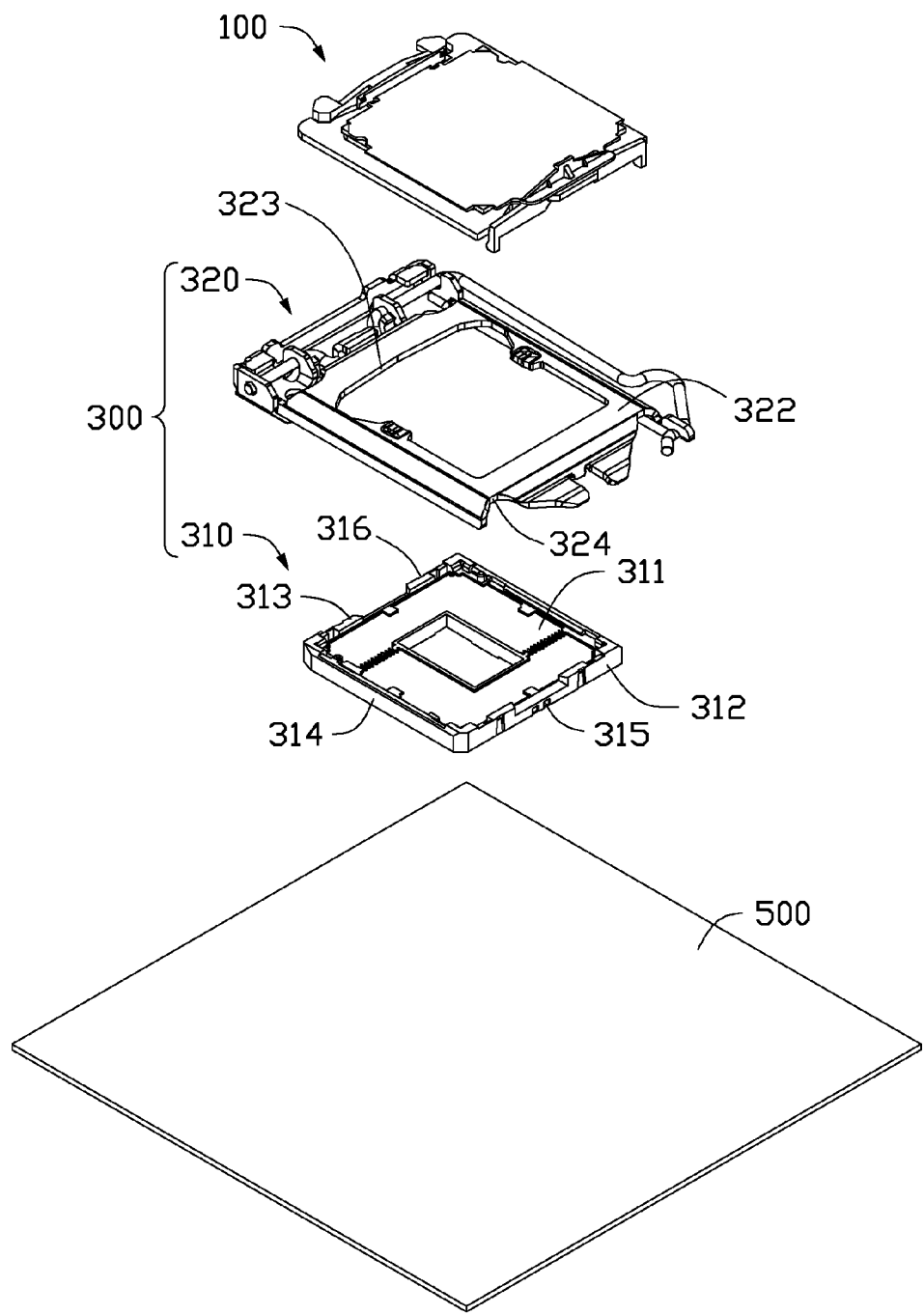
FIG. 1 is an exploded, isometric view of an exemplary embodiment of a central processing unit (CPU) socket assembly, where the CPU socket assembly includes a socket, a locking apparatus, and a cover.

FIG. 1 is an exemplary embodiment of a central processing unit (CPU) socket assembly. The socket assembly includes a CPU socket 300 and a cover 100.

The CPU socket 300 includes a socket 310 capable of being mounted on a circuit board 500 and a locking apparatus 320 for installing a heat dissipation apparatus (not shown in pictures).

The socket 310 is substantially rectangular and includes a top wall 311, a first sidewall 312 perpendicularly connected to a first side of the top wall 311, a second sidewall 313 perpendicularly connected to a second side of the top wall 311 opposite to the first side, and two opposite third sidewalls 314 connected between the first sidewall 312 and the second sidewall 313 and perpendicularly connected to third and fourth sides of the top wall 311 respectively. The top wall 311 defines a plurality of pin holes (not shown in pictures) in which pins of a CPU can be plugged. Two first locating slots 315 are defined in a middle of an outer surface of the first sidewall 315. Two second locating slots 316 are defined in two opposite ends of an outer surface of the second sidewall 313.

The locking apparatus 320 includes a substantially rectangular pressure plate 322. The pressure plate 322 can cover the socket 310. The pressure plate 322 defines an opening 323 in a middle of the pressure plate 322 and four cutouts 324 in four corners of the pressure plate 322.

Figure 2:
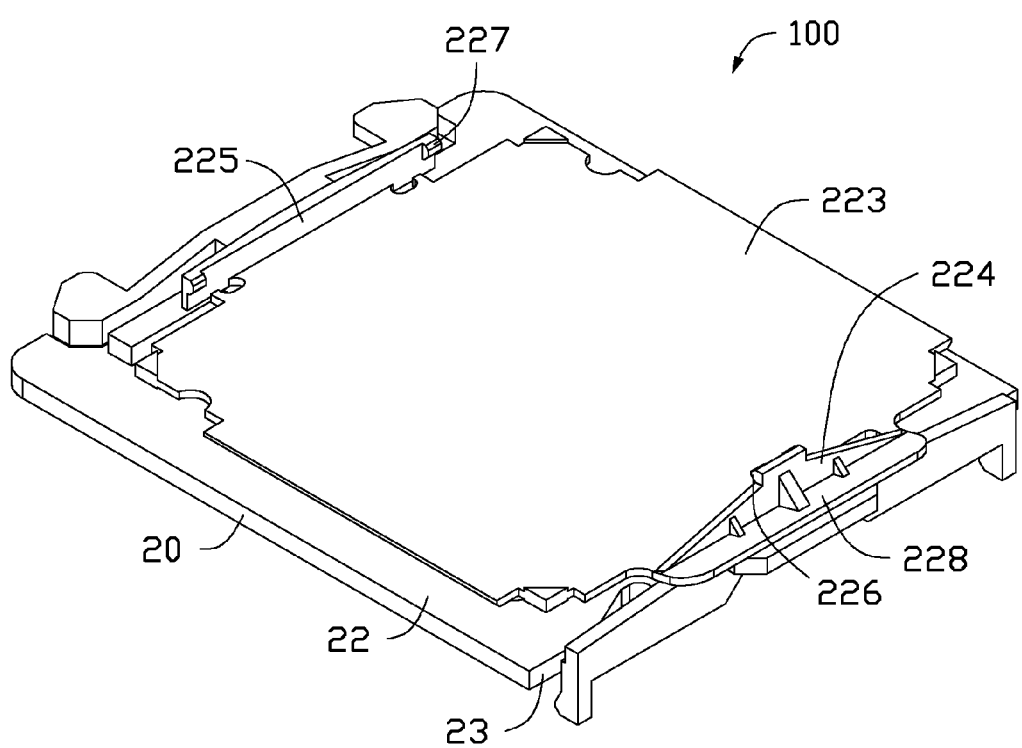
FIG. 2 is an enlarged view of the cover of the FIG. 1.
Figure 3:
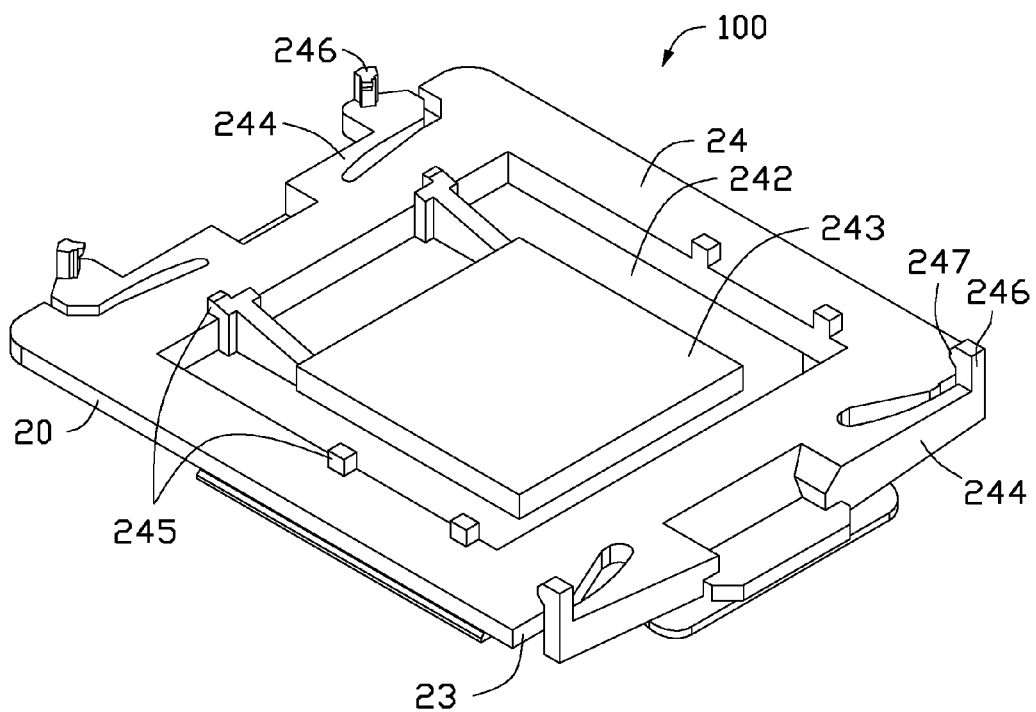
FIG. 3 is an inverted view of the cover of FIG. 2.

FIGS. 2 and 3 show that the cover 100 includes a rectangular main plate 20. The main plate 20 includes a first surface 22, a second surface 24 opposite to the first surface 22, and two opposite end surfaces 23 connected between the first surface 22 and the second surface 24. A rectangular raised portion 223 is formed on the first surface 22. A resilient first locking portion 224 and a second locking portion 225 extend up from two opposite ends of the raised portion 223, adjacent to the end surfaces 23. Two first hooks 226 are formed on a middle of an inner surface of the first locking portion 224, facing the second locking portion 225. Two second hooks 227 are formed on two opposite ends of an inner surface of the second locking portion 225, facing the first locking portion 224. An operation portion 228 extends out from an outer surface of the first locking portion 224.

A middle of the second surface 24 defines a recessed portion 242. A rectangular projecting block 243 extends out from a top wall of the recessed portion 242, away form the raised portion 223. A plurality of positioning blocks 245 perpendicularly protrudes out from the second surface 24, located along an edge of the recessed portion 242. Two opposite and resilient connecting portions 244 are formed on each end surface 23 of the main plate 20. The connecting portions 244 are substantially L-shaped, and extend out from a middle of the corresponding end surface 23 and then extend away from each other. A connecting pin 246 perpendicularly extends from a distal end of each connecting portion 244, away from the raised portion 223. A third hook 247 is formed on an inner surface of each connecting pin 246, facing the second surface 24 of the main plate 20.

Figure 4:
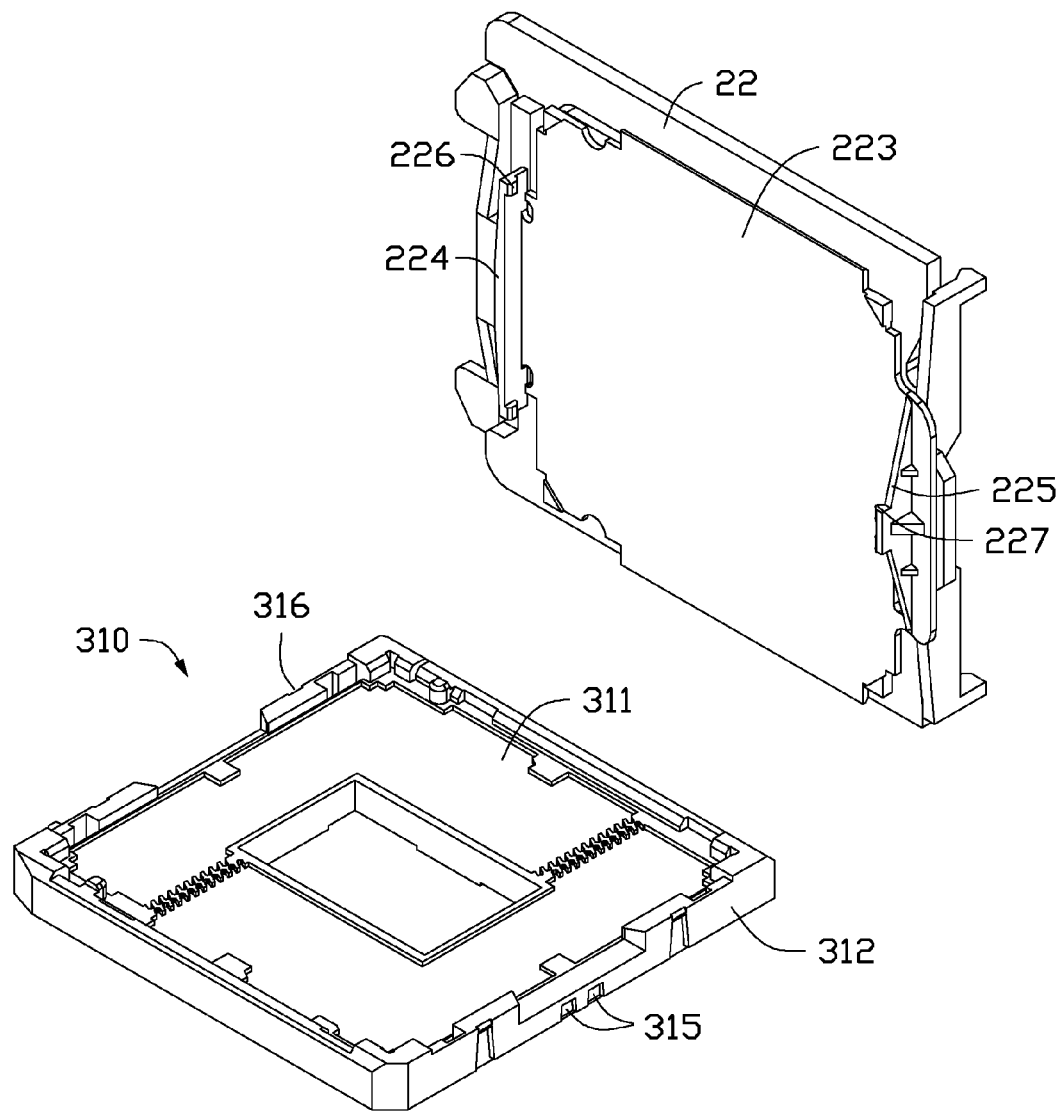
FIGS. 4-7 are isometric views showing a process of assembling the CPU socket assembly of FIG. 1.
Figure 5:
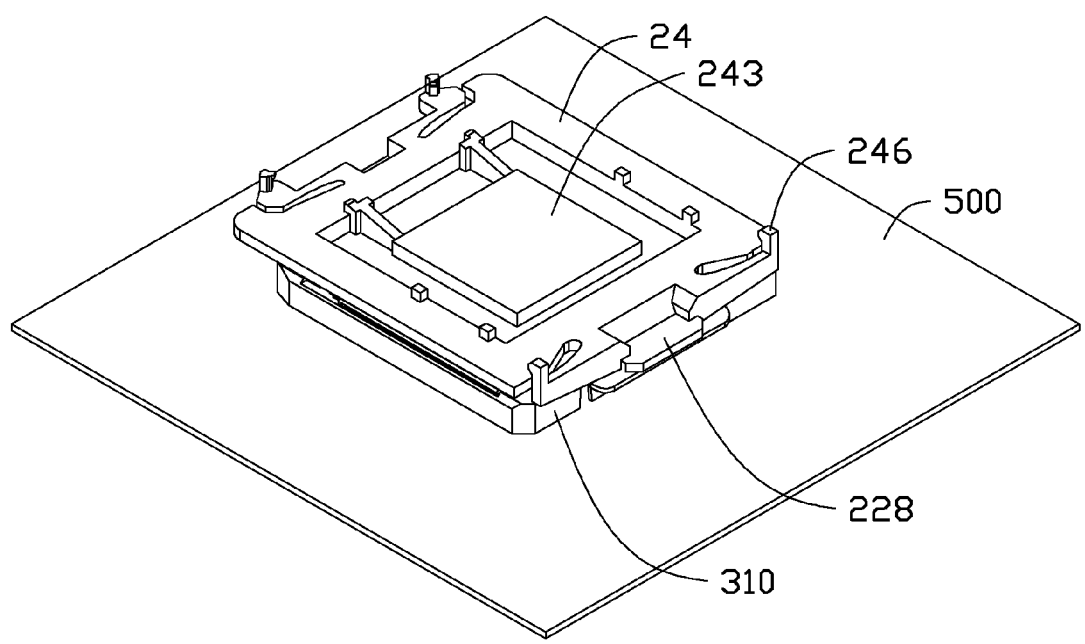

FIGS. 4 and 5 show that the first surface 22 of the cover 100 faces the top wall 311 of the socket 310. The raised portion 223 covers the top wall 311, the first hooks 226 align with the first locating slots 315, and the second hooks 225 align with the second locating slots 316. The second surface 24 of the cover 100 is pressed toward the socket 310, deforming the first locking portion 224 out, until the first hooks 226 are locked in the first locating slots 315, and the second hooks 227 are locked in the second locating slots 316. Thus, the cover 100 covers the top wall 311 for preventing the socket 310 from being damaged.

A combination of the cover 100 and the socket 310 is mounted on the circuit board 500 by surface mount technology placement machine sucking up an outer surface of the projecting block 243.

Figure 6:
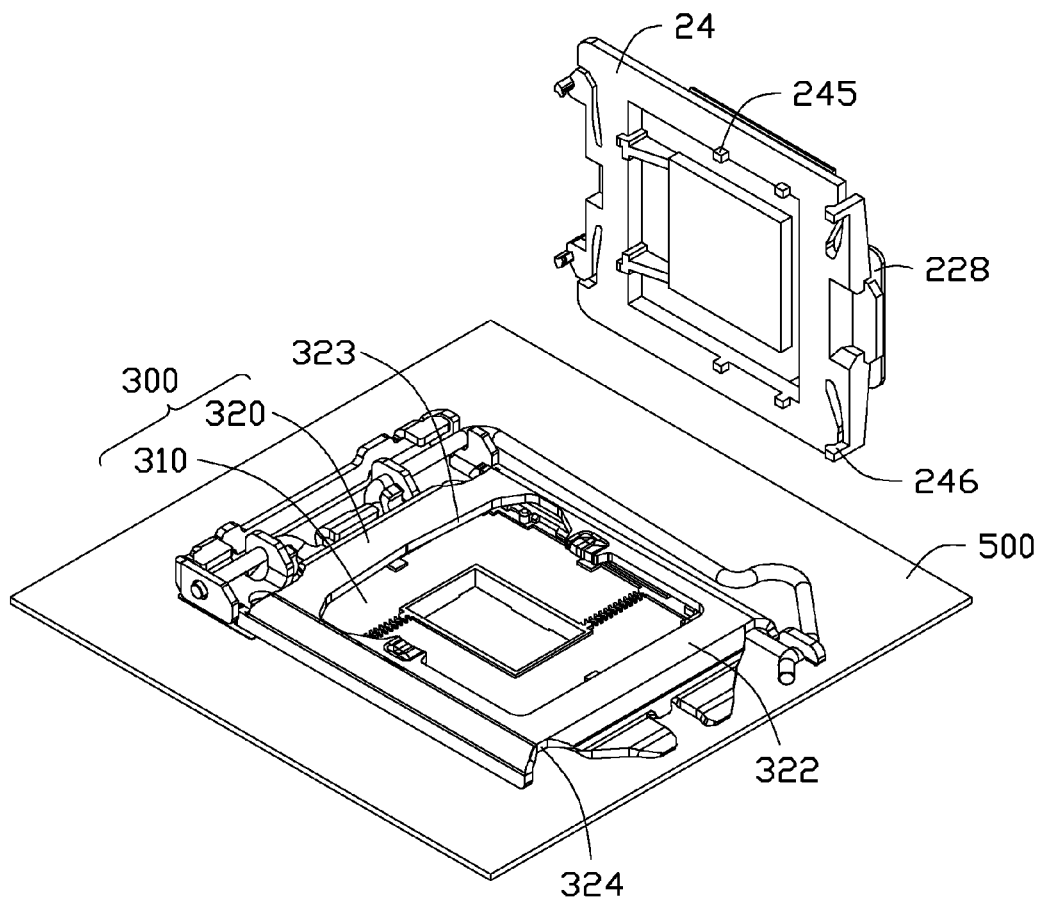
Figure 7:
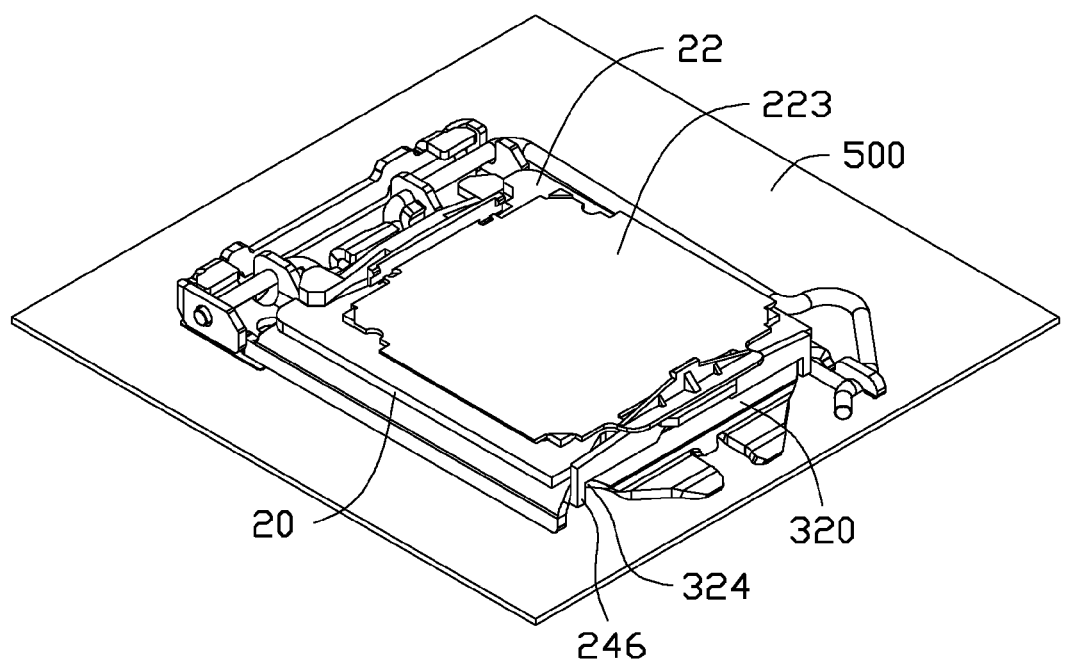

FIGS. 6-7 show that the operation portion 228 is operated, deforming the first locking portion 224, to allow the first hooks 226 and the second hooks 227 to detach from the first locating slots 315 and the second locating slots 316. The cover 100 is detached from the socket 310. The locking apparatus 320 is installed on the circuit board 500, above the socket 310. The opening 323 of the locking apparatus 320 aligns with the top wall 311 of the socket 310. The second surface 24 of the cover 100 faces the locking apparatus 320. The recessed portion 242 aligns with the opening 323, and the connecting pins 246 align with the cutouts 324 of the pressure plate 322. The first surface 22 of the cover 100 is pressed toward the locking apparatus 320, deforming the connecting portions 244 out, until the third hooks 247 are locked in the corresponding cutouts 324. The positioning blocks 245 engage with a sidewall bounding the opening 323. Thus, the cover 100 covers the pressure plate 322 preventing the socket 310 from being damaged.

It is to be understood, however, that even though numerous characteristics and advantages of certain embodiments have been set forth in the foregoing description, together with details of the structures and functions of the embodiments, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A cover, comprising:
    a main plate;
    a resilient first locking portion formed on a first end of a first surface of the main plate;
    a second locking portion formed on a second end of the first surface of the main plate opposite to the first locking portion; and
    a plurality of connecting pins protruding out from a second surface of the main plate away from the first surface of the main plate;
    wherein a middle of the second surface defines a recessed portion, and a rectangular projecting block extends out from an inner surface of the recessed portion.

2. The cover of claim 1, wherein a rectangular raised portion is formed on the first surface of the main plate, the first and second locking portions extend out from two opposite ends of the raised portion away from the main plate, a first hook is formed on the first locking portion facing the raised portion, and a second hook is formed on the second locking portion facing the raised portion.

3. The cover of claim 2, wherein the main plate further comprises two opposite end surfaces connected between the first surface and the second surface, two resilient connecting portions are formed on each end surface of the main plate, the connecting portion extend out from a middle of the corresponding end surface, the connecting pins are respectively extended out from distal ends of the corresponding connecting portions.

4. The cover of claim 1, wherein an operation portion extends out from the first locking portion away from the raised portion.

5. A central processing unit (CPU) socket assembly, comprising:
    a socket mounted on a circuit board, and comprising a first sidewall and a second sidewall opposite to the first sidewall, the first sidewall defining a first locating slot, the second sidewall defining a second locating slot;
    a locking apparatus installed on the circuit board above the socket, comprising a pressure plate defining a plurality of cutouts; and
    a cover comprising a main plate, a resilient first locking portion formed on a first end of a first surface of the main plate, a second locking portion formed on a second end of the first surface of the main plate opposite to the first locking portion, and a plurality of connecting pins protruding out from a second surface of the main plate opposite to the first surface of the main plate;
    wherein the first and second locking portions of the first surface of the cover are operable to be detachably latched to the first locating slot and the second locating slot, respectively, and the connecting pins of the second surface of the cover are operable to be engaged in the cutouts of the locking apparatus; and
    wherein a rectangular raised portion is formed on the first surface of the main plate, the first and second locking portions extend out from two opposite ends of the raised portion away from the main plate, a first hook is formed on the first locking portion, and a second hook is formed on the second locking portion, the first hook is detachably latched in the first locating slot of the socket, and the second hook is detachably latched in the second locating slot of the socket.

6. The CPU socket assembly of claim 5, wherein an operation portion extends out from the first locking portion away from the raised portion, operated to deform the first locking portion.

7. The CPU socket assembly of claim 5, wherein the main plate comprises two opposite end surfaces, two resilient connecting portions are formed on each end surface of the main plate, the connecting portions extend out from a middle of the corresponding end surface and then extend away from each other, the connecting pins are extended out from distal ends of the corresponding connecting portions.

8. The CPU socket assembly of claim 5, wherein the pressure plate defines an opening opposite to the socket, a plurality of positioning blocks protrudes out from the second surface and is engaged with a sidewall bounding the opening.

9. The CPU socket assembly of claim 5, wherein a middle of the second surface defines a recessed portion, a rectangular projecting block extends out from an inner surface of the recessed portion.

10. A cover, comprising:
    a main plate;
    a resilient first locking portion formed on a first end of a first surface of the main plate;
    a second locking portion formed on a second end of the first surface of the main plate opposite to the first locking portion; and
    a plurality of connecting pins protruding out from a second surface of the main plate away from the first surface of the main plate;
    wherein a rectangular raised portion is formed on the first surface of the main plate, the first and second locking portions extend out from two opposite ends of the raised portion away from the main plate, a first hook is formed on the first locking portion facing the raised portion, and a second hook is formed on the second locking portion facing the raised portion; and
    wherein the main plate further comprises two opposite end surfaces connected between the first surface and the second surface, two resilient connecting portions are formed on each end surface of the main plate, the connecting portion extend out from a middle of the corresponding end surface, the connecting pins are respectively extended out from distal ends of the corresponding connecting portions.

* * * * *